(12) United States Patent
Lin

(10) Patent No.: US 7,679,088 B2
(45) Date of Patent: Mar. 16, 2010

(54) THIN-FILM TRANSISTOR AND FABRICATION METHOD THEREOF

(75) Inventor: Han-Tu Lin, Taichung County (TW)

(73) Assignee: AU Optronics Corp., Hsin-Chu (TW)

( * ) Notice: Subject to any disclaimer, the term of this patent is extended or adjusted under 35 U.S.C. 154(b) by 82 days.

(21) Appl. No.: 12/146,479

(22) Filed: Jun. 26, 2008

(65) Prior Publication Data

US 2008/0258146 A1 Oct. 23, 2008

Related U.S. Application Data

(63) Continuation of application No. 11/530,897, filed on Sep. 11, 2006, now Pat. No. 7,413,940.

(30) Foreign Application Priority Data

May 18, 2006 (TW) .............................. 95117648 A

(51) Int. Cl.
*H01L 29/04* (2006.01)
*H01L 31/036* (2006.01)

(52) U.S. Cl. ........................ 257/72; 257/59; 257/347; 438/158

(58) Field of Classification Search ................ 257/72, 257/59, 347, E27.125, E29.117, E29.145; 438/158

See application file for complete search history.

(56) References Cited

U.S. PATENT DOCUMENTS

| | | |
|---|---|---|
| 4,684,435 A | 8/1987 | Kishi et al. |
| 5,598,012 A | 1/1997 | Hebiguchi |
| 5,828,082 A | 10/1998 | Wu |
| 6,303,946 B1 * | 10/2001 | Sung ............................ 257/72 |
| 6,399,258 B2 | 6/2002 | O'Brien |
| 6,894,747 B2 | 5/2005 | Okumura |
| 7,145,174 B2 | 12/2006 | Chiang |
| 7,294,881 B2 | 11/2007 | Korenari |
| 2002/0125481 A1 | 9/2002 | Kimura |
| 2005/0285107 A1 | 12/2005 | Koo et al. |
| 2006/0097260 A1 | 5/2006 | Huang |
| 2006/0278877 A1 * | 12/2006 | Kim et al. ..................... 257/72 |

FOREIGN PATENT DOCUMENTS

| | | |
|---|---|---|
| CN | 1202742 A | 12/1998 |
| CN | 1348553 A | 5/2002 |
| CN | 1403861 A | 3/2003 |
| JP | 1-259565 | 10/1989 |
| JP | 2-230125 | 9/1990 |

* cited by examiner

*Primary Examiner*—Theresa T Doan
(74) *Attorney, Agent, or Firm*—Winston Hsu

(57) ABSTRACT

A fabrication method of a TFT includes successively forming four thin films containing a first conductive layer, an insulation layer, a semiconductor layer, and a second conductive layer on a substrate, performing a first PEP process to pattern the four thin films for forming a semiconductor island and a gate electrode with the semiconductor layer and the first conductive layer respectively. Then, a laser ablation process is performed to define a channel pattern in the four thin films and remove a portion of the second conductive layer so that unconnected source electrode and drain electrode are formed with the second conductive layer.

6 Claims, 13 Drawing Sheets

THIN-FILM TRANSISTOR AND FABRICATION METHOD THEREOF

CROSS REFERENCE TO RELATED APPLICATIONS

This application is a continuation of applicant's earlier application, Ser. No. 11/530,897, filed Sep. 11, 2006.

BACKGROUND OF THE INVENTION

1. Field of the Invention

The present invention relates to a thin-film transistor (TFT) structure and a fabrication method thereof, and more particularly, to a TFT structure and a fabrication method with a laser ablation process.

2. Description of the Prior Art

Due to the continued development in technology, flat displays have been widely used in various information products. Common flat displays comprise liquid crystal displays (LCD), organic light-emitting displays (OLED), and plasma display panels (PDP). Among the various types of flat displays, LCDs are developed maturely. Because TFT-LCDs have qualities of light weight, thinness, low energy requirements, and no radiation, they have been widely used in portable information products, such as notebook computers, personal digital assist (PDA), and mobile phones. Conventionally, the main electric elements of a LCD are thin-film transistors arranged as an array. In operation with appropriate capacitors and conducting pads, the thin-film transistors drive liquid crystal pixels to produce colorful images, and therefore a thin-film transistor is one of the key elements affecting the image quality of a TFT-LCD.

A thin-film transistor comprises a gate electrode, a source electrode, a drain electrode, and a semiconductor layer for forming a channel of the thin-film transistor. A typical fabrication process of a conventional thin-film transistor has to perform five photolithography processes, which means five photomasks is needed for defining the patterns of the thin-film transistor. However, since the costs of photomasks seriously influence the fabrication costs of display panels, a new fabrication process of thin-film transistor array by using four photomasks, including a half-tone mask, has been researched in order to reduce the fabrication costs.

With reference to FIGS. 1-4, FIGS. 1-4 are schematic diagrams of the fabrication process of a thin-film transistor by using four photomasks according to the prior art. As shown in FIG. 1, a first conductive layer and a photoresist layer are formed on the transparent substrate 10 in order. Then, a first photolithography-etching process (PEP) is carried out to form a gate electrode 12 and a wire pattern 14. Thereafter, the photoresist layer is removed. As shown in FIG. 2, an insulation layer 16, a semiconductor layer 18, an ohmic contact layer 20, a second conductive layer 22, and a photoresist layer 24 are sequentially formed on the surface of the transparent substrate 10.

Then, as shown in FIG. 3, a half-tone mask 26 is used to perform a second PEP for patterning the photoresist layer 24, wherein the half-tone region 26a of the half-tone mask 26 corresponds to the predetermined channel region above the gate electrode 12. Accordingly, an etching mask is formed with the photoresist layer 24 above the transparent substrate 10 where is a predetermined semiconductor island area. Referring to FIG. 4, the etching mask is used to perform an etching process for removing portions of the semiconductor layer 18, the ohmic contact layer 20, and the second conductive layer 22 so as to from a semiconductor island 32, a drain electrode 28, and a source electrode 30. Finally, several deposition processes, a third and a fourth photolithography step and several etching processes are carried out to form a passivation layer and a pixel electrode electrically connected to the source electrode 30 on the transparent substrate 10 so that the fabrication of the thin-film transistor and pixel electrode of each pixel or sub-pixel is finished.

As mentioned above, the prior-art fabrication method of thin-film transistors uses the half-tone mask during the second PEP process by taking its half-tone region to define the channel pattern of the thin-film transistor. Because the size of the channel pattern of the thin-film transistor is very detailed and minute, the half-tone mask for defining the channel pattern by its half-tone region has to be very accurate, whose formation cost is very high and is twice as the formation cost of normal photomask. In addition, once a defect of the transference of the channel pattern occurs during the second PEP by using a half-tone mask, it will seriously affect the electric property of the thin-film transistor, which is hard to be repaired. Furthermore, according to the prior-art process of fabricating a thin-film transistor, both of the source and drain patterns cover the semiconductor layer so that photo current is easily induced since most materials of the semiconductor layer are amorphous silicon materials that have photo sensitivity, and photo current affects the electrical performance of the thin-film transistor.

Therefore, how to fabricate thin-film transistors with good qualities by low-cost processes to avoid the photo current problem is still an important issue for the manufactures.

SUMMARY OF THE INVENTION

It is therefore a primary objective of the present invention to provide a thin-film transistor structure and a fabrication method thereof through a laser ablation process for solving the above-mentioned problems of high cost and photo current of the prior-art method for fabricating thin-film transistors.

According to the claimed invention, a method for fabricating a thin-film transistor is provided. The method comprises forming four thin films on a substrate successively, wherein the four thin films comprise a first conductive layer, an insulating layer, a semiconductor layer, and a second conductive layer from bottom to top; performing a first PEP to simultaneously pattern the four thin films for forming a semiconductor island and a gate electrode with the semiconductor layer and the first conductive layer respectively; and performing a laser ablation process to define a channel pattern in the four thin films and remove a portion of the second conductive layer so that the second conductive layer forms a source electrode and a drain electrode unconnected to the source electrode.

According to the claimed invention, a thin-film transistor structure is further provided. The thin-film transistor structure comprises a gate electrode positioned on a substrate, a gate insulating layer covering the gate electrode, a semiconductor island positioned on the gate insulating layer, a source electrode and a drain electrode positioned on two sides of the semiconductor island not contact with each other, a passivation layer covering the gate electrode, the gate insulating layer, the semiconductor island, the source electrode, the drain electrode and the substrate, and a pixel electrode covering portions of the passivation layer and the source electrode, wherein the pixel electrode is electrically connected to the source electrode, and the sizes of the gate insulating layer and the gate electrode are approximately the same and larger than the size of the semiconductor island so that the gate electrode and the gate insulating layer protrude from the two sides of the semiconductor island to form a stair structure respectively. The passivation layer step covers the surfaces of the stair structures.

It is an advantage of the claimed invention that the fabrication method of thin-film transistors simultaneously etching the first conductive layer, the first insulating layer, the semiconductor layer, and the second conductive layer, so that there is no semiconductor layer existing below most portions of data lines, which effectively avoids the occurrence of photo current and improves the quality of the thin-film transistor. Furthermore, the claimed invention method utilizes a laser ablation process to define the channel pattern of the semiconductor island such that at least a photolithography process can be omitted. As a result, the number of photomasks utilized during the fabrication method may be reduced, and the process cost can be effectively lowered while forming thin-film transistors with good qualities.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
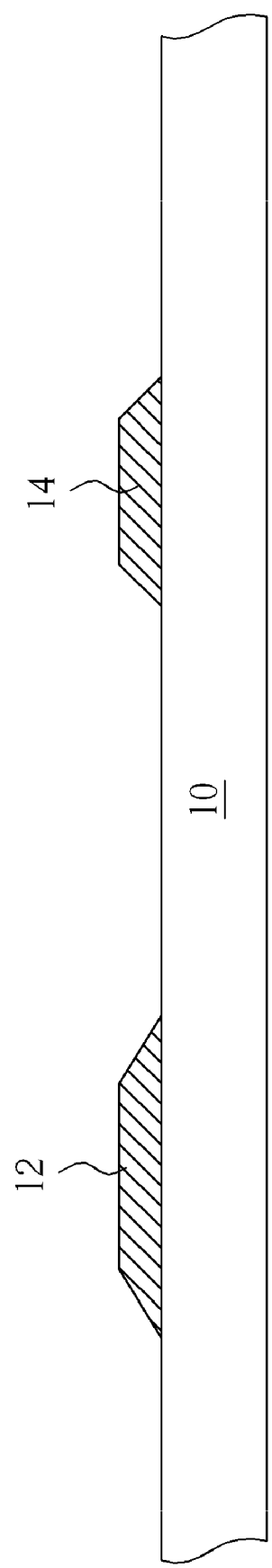
FIGS. 1-4 are schematic diagrams of the fabrication process of a thin-film transistor by using four photomasks according to the prior art.
Figure 2:
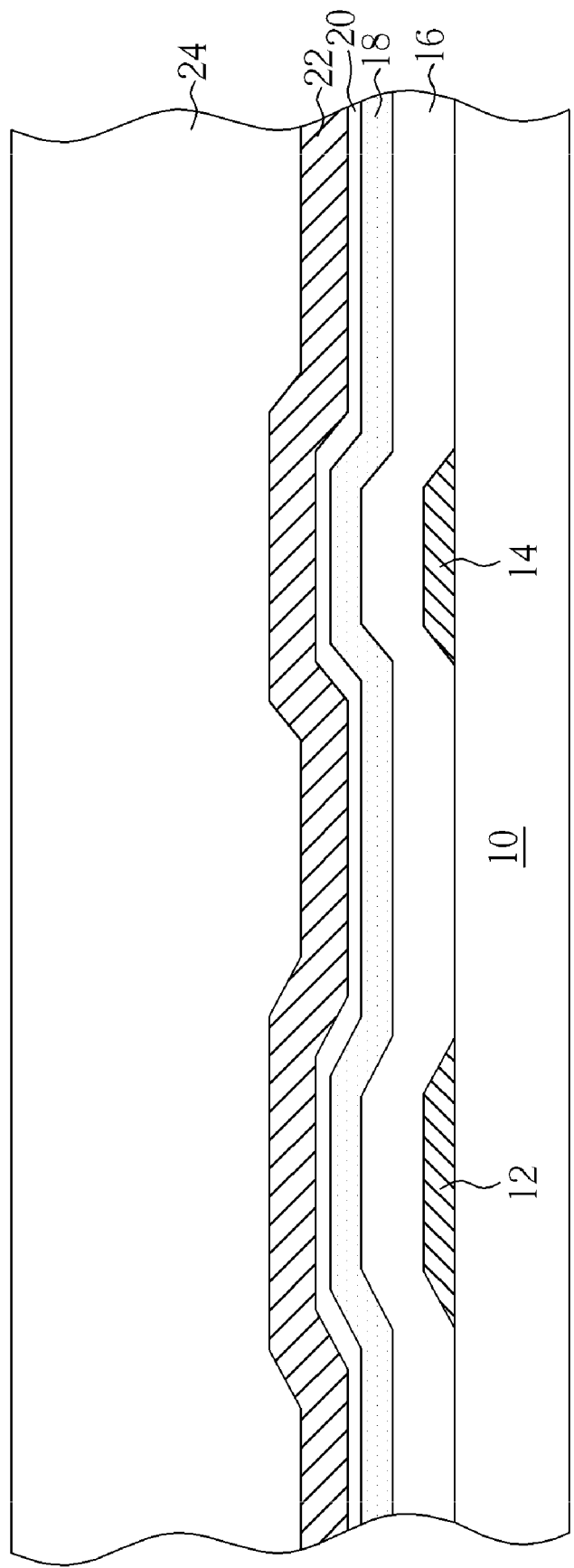
Figure 3:
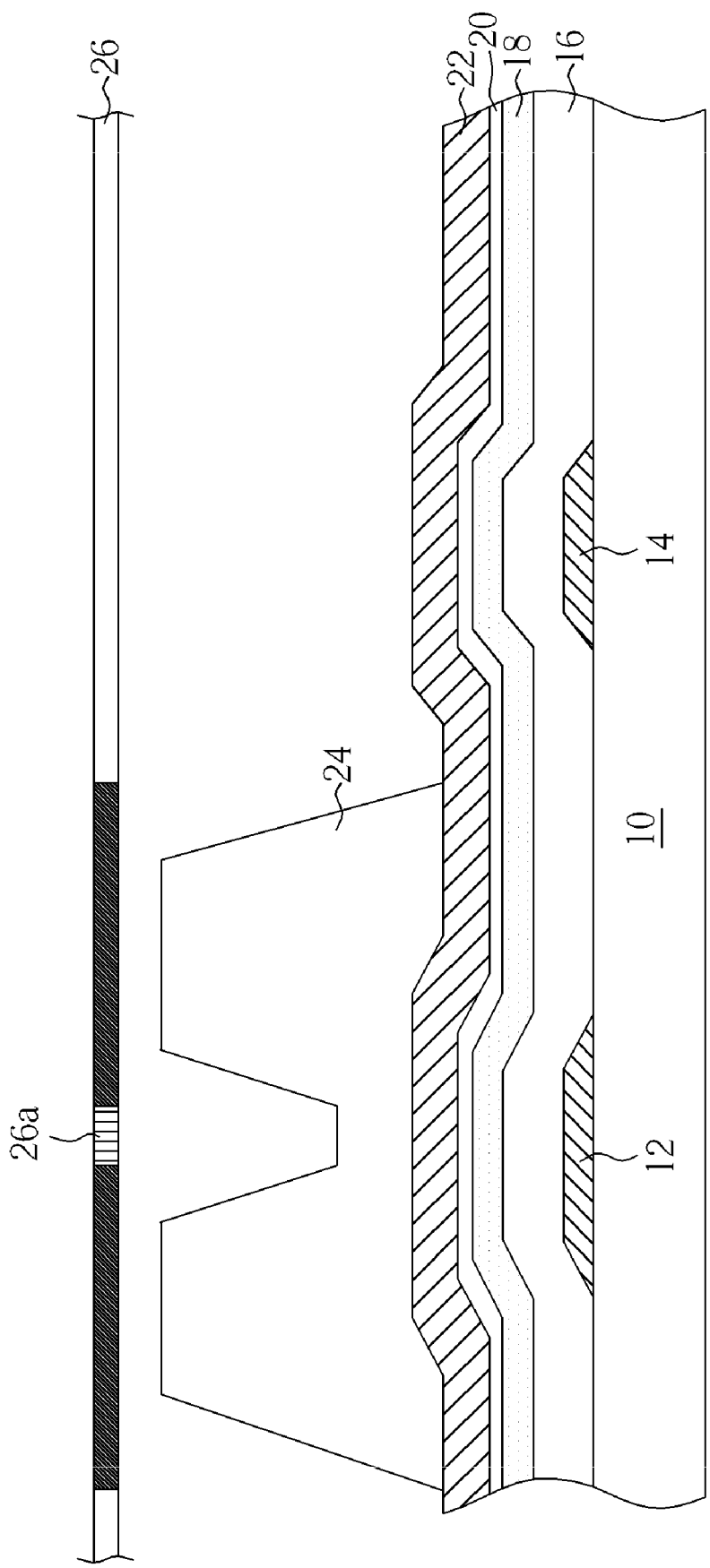
Figure 4:
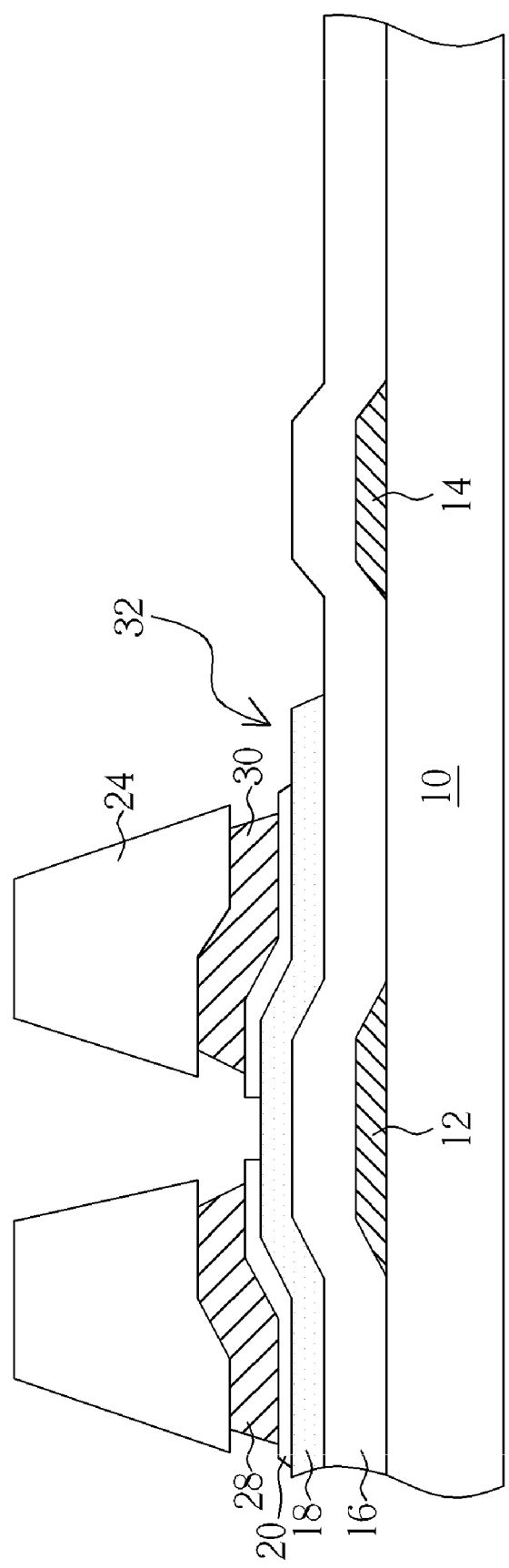
Figure 5:
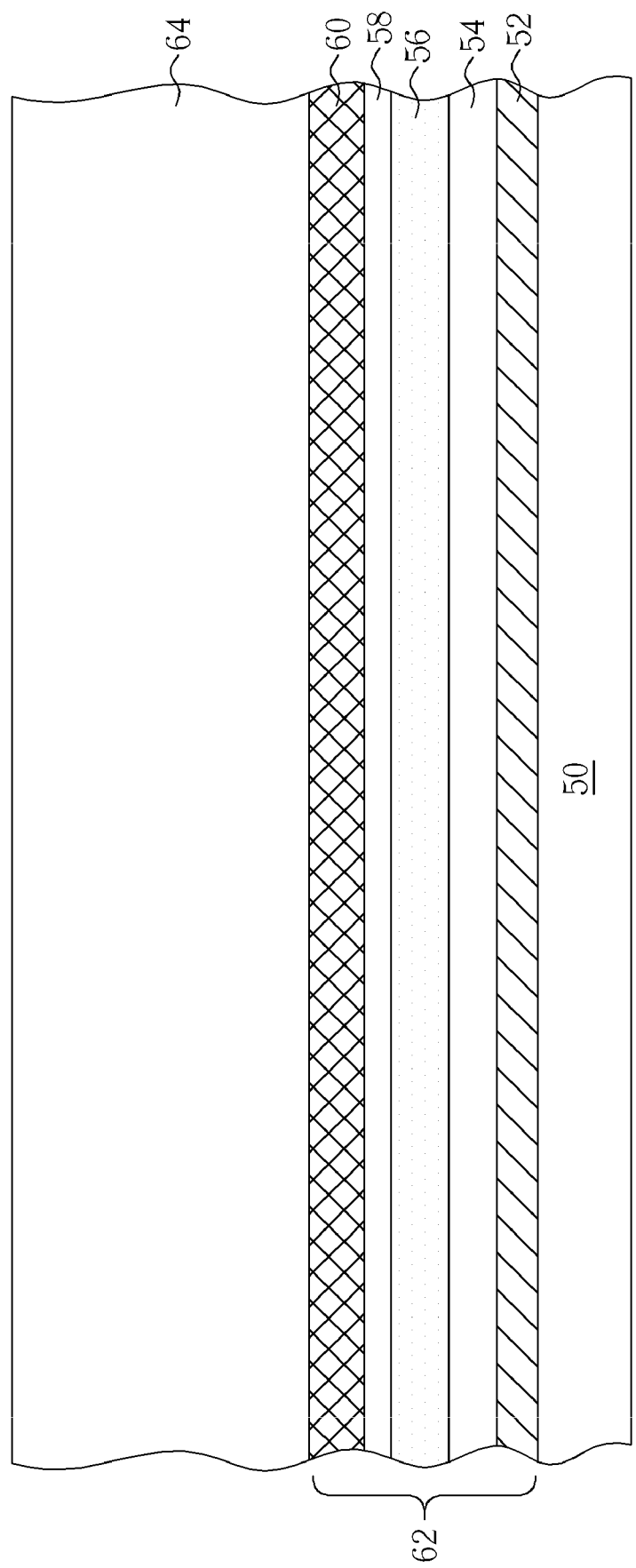
FIGS. 5-11 are schematic diagrams of the fabrication process of a thin-film transistor according to a first embodiment of the present invention.

FIGS. 5-11 are schematic diagrams of the fabrication process of a thin-film transistor according to a first embodiment of the present invention. Referring to FIG. 5, first, a transparent substrate 50 is provided, wherein the substrate 50 may be a glass substrate, a quartz substrate, or a plastic substrate. Then, four thin films 62 are successively formed on the surface of the substrate 50, and the four thin films 62 comprises a first conductive layer 52, an insulating layer 54, a semiconductor layer 56, and a second conductive layer 60 from bottom to top. However, during forming the four thin films 62, an ohmic contact layer 58, such as an N+ doped layer, may be formed between the second conductive layer 60 and the semiconductor layer 56 in order to reduce the resistance between these two layers. In other words, the first conductive layer 52, the insulating layer 54, the semiconductor layer 56, the ohmic contact layer 58, and the second conductive layer 60 are successively formed on the surface of the substrate 50, as shown in FIG. 5. Thereafter, a photoresist layer 64 is formed above the four thin films 62.

Figure 6:
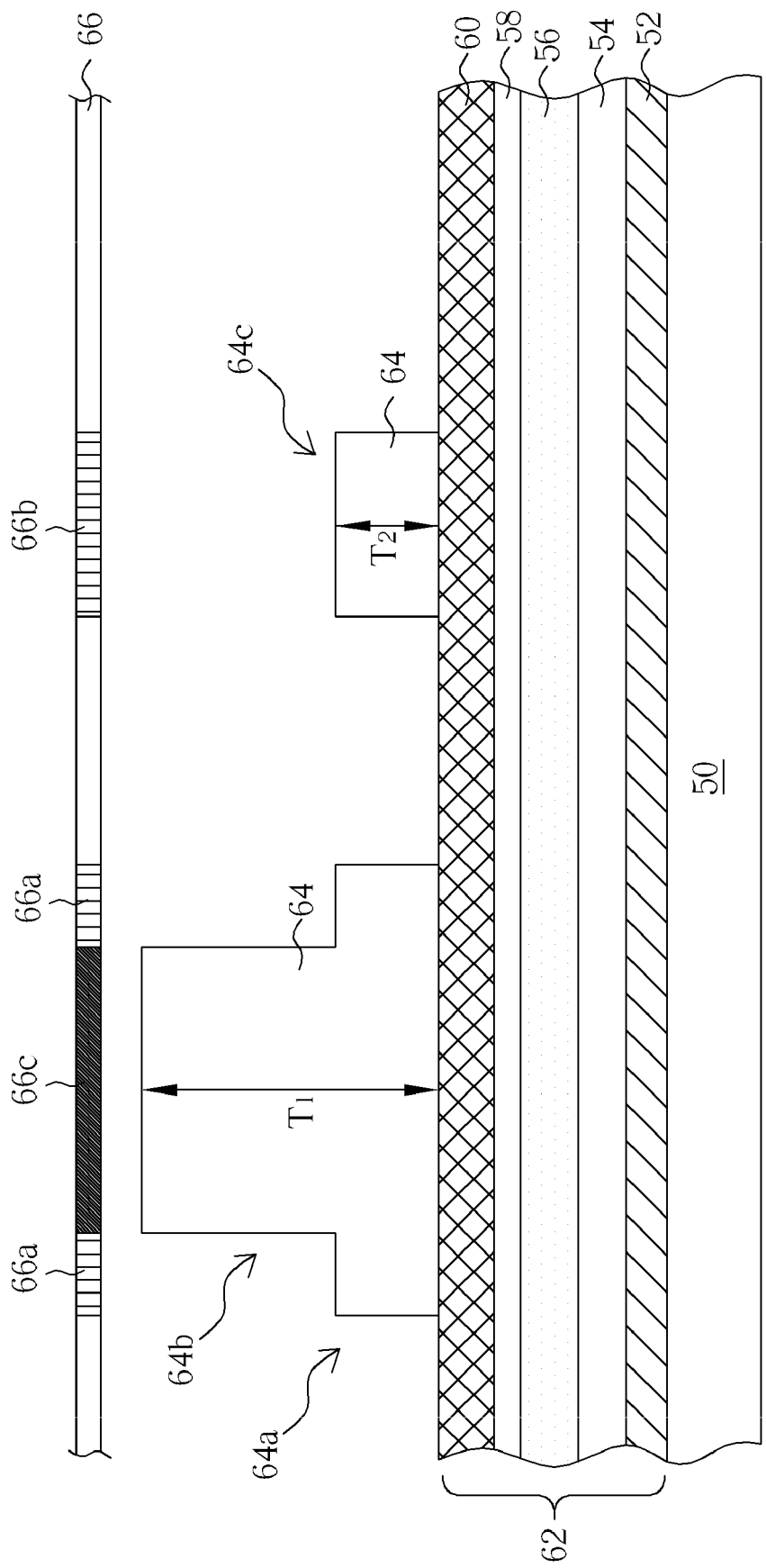
Figure 7:
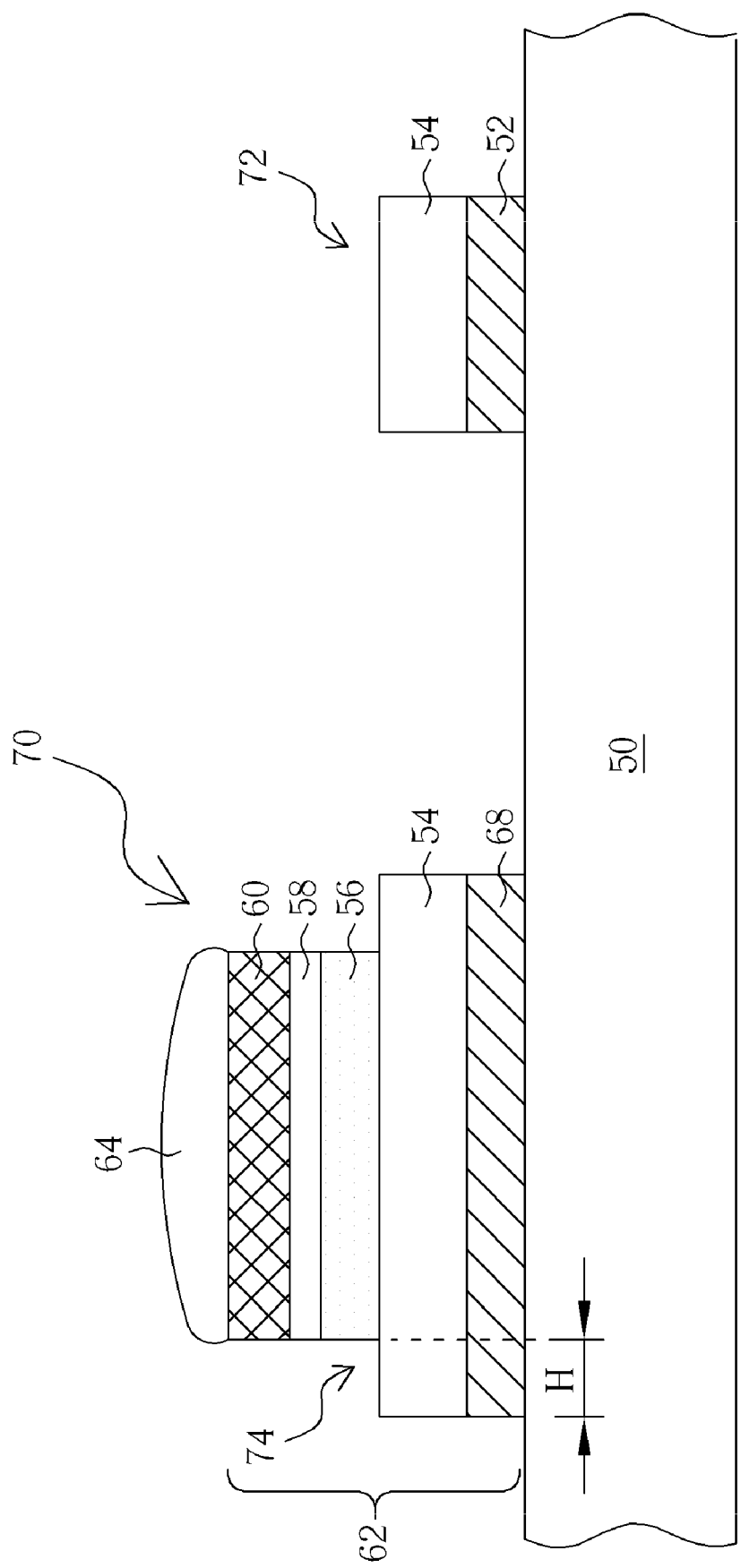

As shown in FIG. 6, a first PEP is performed by using a half-tone mask 66 to define a gate pattern 64a, a semiconductor island pattern 64b, and a wire pattern 64c on the photoresist layer 64. It should be noted that the fringe portions of the gate pattern 64a is defined by the first half-tone region 66a of the half-tone mask 66, while the wire pattern 64c is defined by the second half-tone region 66b of the half-tone mask 66. However, an opaque region 66c is placed between the first half-tone region 66a of the half-tone mask 66 for defining the semiconductor island pattern 64b in the central portion of the gate pattern 64a, wherein the semiconductor island pattern 64b defined by the opaque region 66c has a photoresist layer thickness $T_1$ larger than the photoresist layer thickness $T_2$ of the gate pattern 64a or the wire pattern 64c defined by the first and the second half-tone regions 66a, 66b. Thereafter, the patterned photoresist layer 64 is taken as an etching mask for etching the four thin films 62 to form a gate electrode 68, a semiconductor island 70, and a wire structure 72, wherein the residual insulating layer 54 serves as a gate insulating layer. As shown in FIG. 7, after the etching process, the areas of the gate electrode 68 and the insulating layer 54 thereon are larger than the area of the semiconductor island 70 so that a stair structure 74 is formed at each of the two sides of the four thin films 62. In preferable embodiments, the protrudent portion that the insulating layer 54 and the gate electrode 68 protrude from the semiconductor island 70 of each stair structure 74 has a width H of about 2 to 4 micrometers (μm). In addition, there are some residual portions of the photoresist layer 64 remain on the surface of the second conductive layer 60 after the first PEP.

Figure 8:
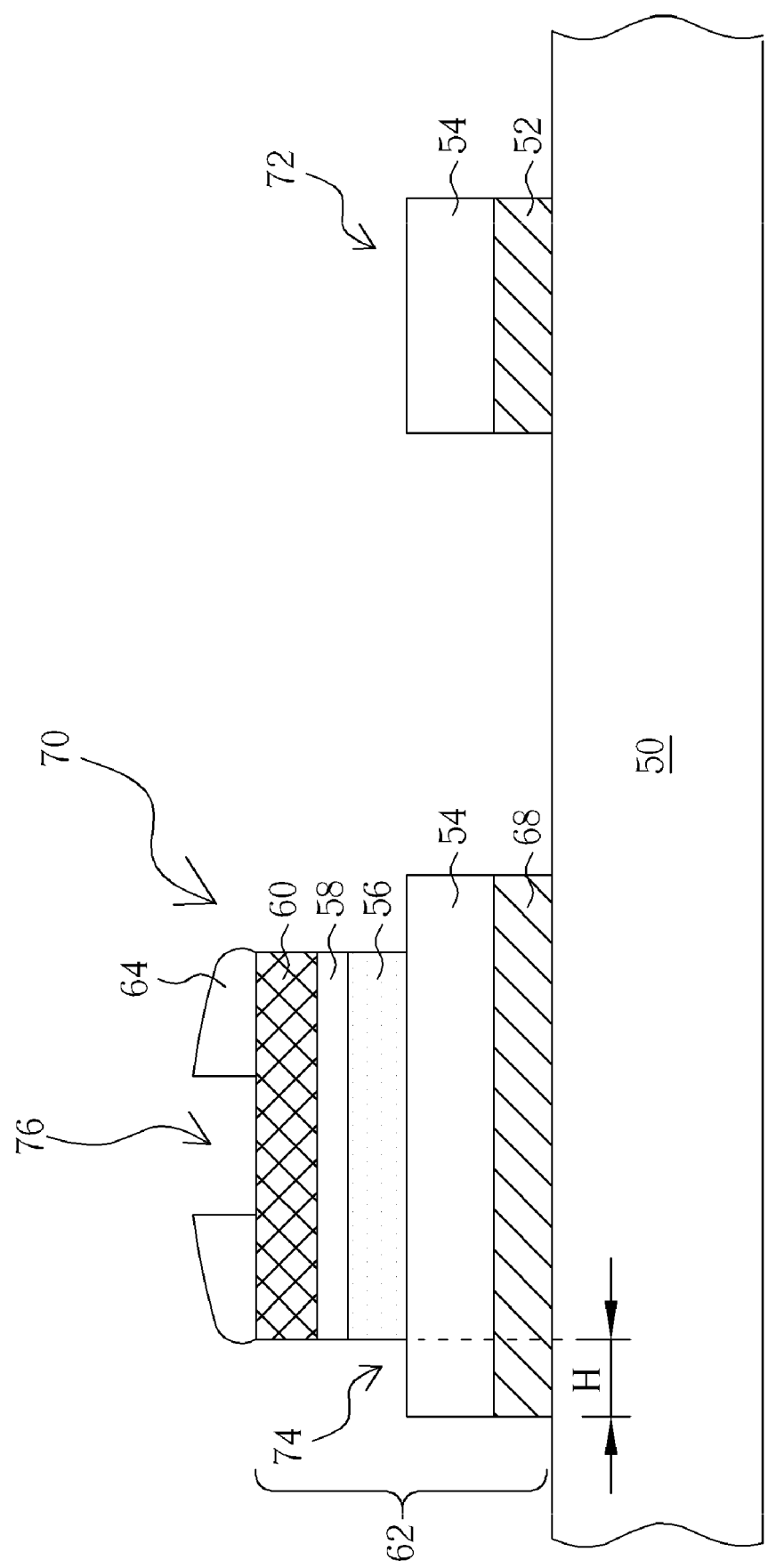
Figure 9:
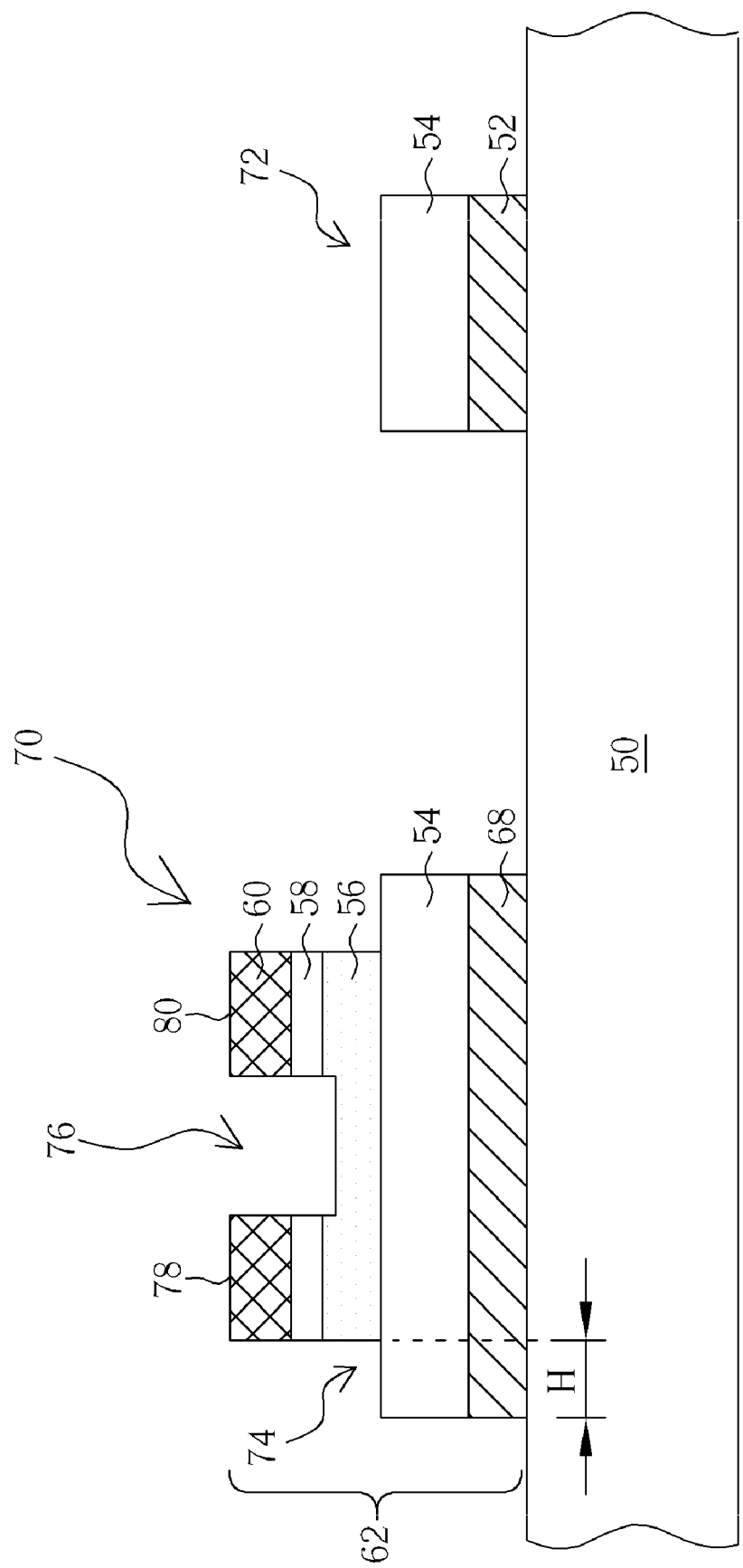

Then, referring to FIG. 8, a first laser ablation process is performed to the semiconductor island 66 to directly remove a portion of the residual photoresist layer 64 for defining a channel pattern 76 of the thin-film transistor. As shown in FIG. 9, the photoresist layer 64 with the channel pattern 76 is taken as an etching mask to perform a first etching process to the second conductive layer 60 and the ohmic contact layer 58 for transferring the channel pattern 76 onto the semiconductor island 70 and forming a drain electrode 78 and a source electrode 80 which separate from each other and are formed with the second conductive layer 60, which is followed by removing the photoresist layer 64.

Figure 10:
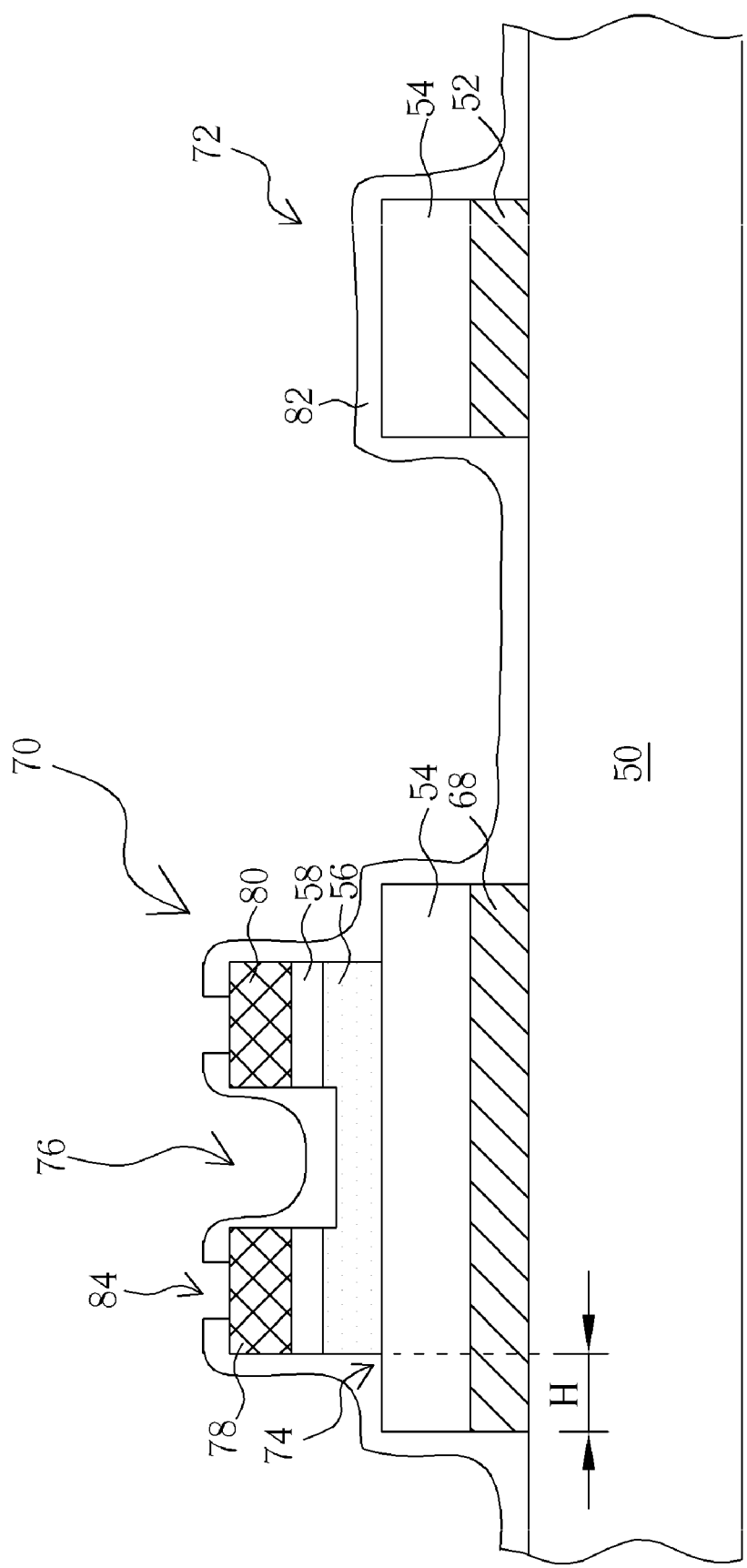

As shown in FIG. 10, a passivation layer 82 is sequentially formed on the substrate 50, covering the surfaces of the semiconductor island 70 and the wire structure 72. It should be noted that the deposition process can form the conformal passivation layer 82 that uniformly step covers and directly contacts the top surface or sidewall surfaces of the gate electrode 68, insulating layer 54, the semiconductor layer 56, the ohmic contact layer 58, source electrode 80, and the drain electrode 78 because the two fringe sides of the semiconductor island 70 have the stair structures 74, each of which has a protrudent portion of about 2 to 4 μm. Thereafter, a second laser ablation process is performed to remove a portion of the passivation layer 82 positioned on the source electrode 80 and the drain electrode 78 so as to form a contact hole 84 on each of the source electrode 80 and the drain electrode 78. In other embodiments, the second laser ablation process may be replaced by a second PEP includes the steps of forming a photoresist layer (not shown) on the substrate 50 after forming the passivation layer 82, performing a photolithography process to define the patterns of the contact hole 84, etching the passivation layer 82 by taking the patterned photoresist layer as an etching mask to form the contact holes 84 through the passivation layer 82, and removing the photoresist layer.

Figure 11:
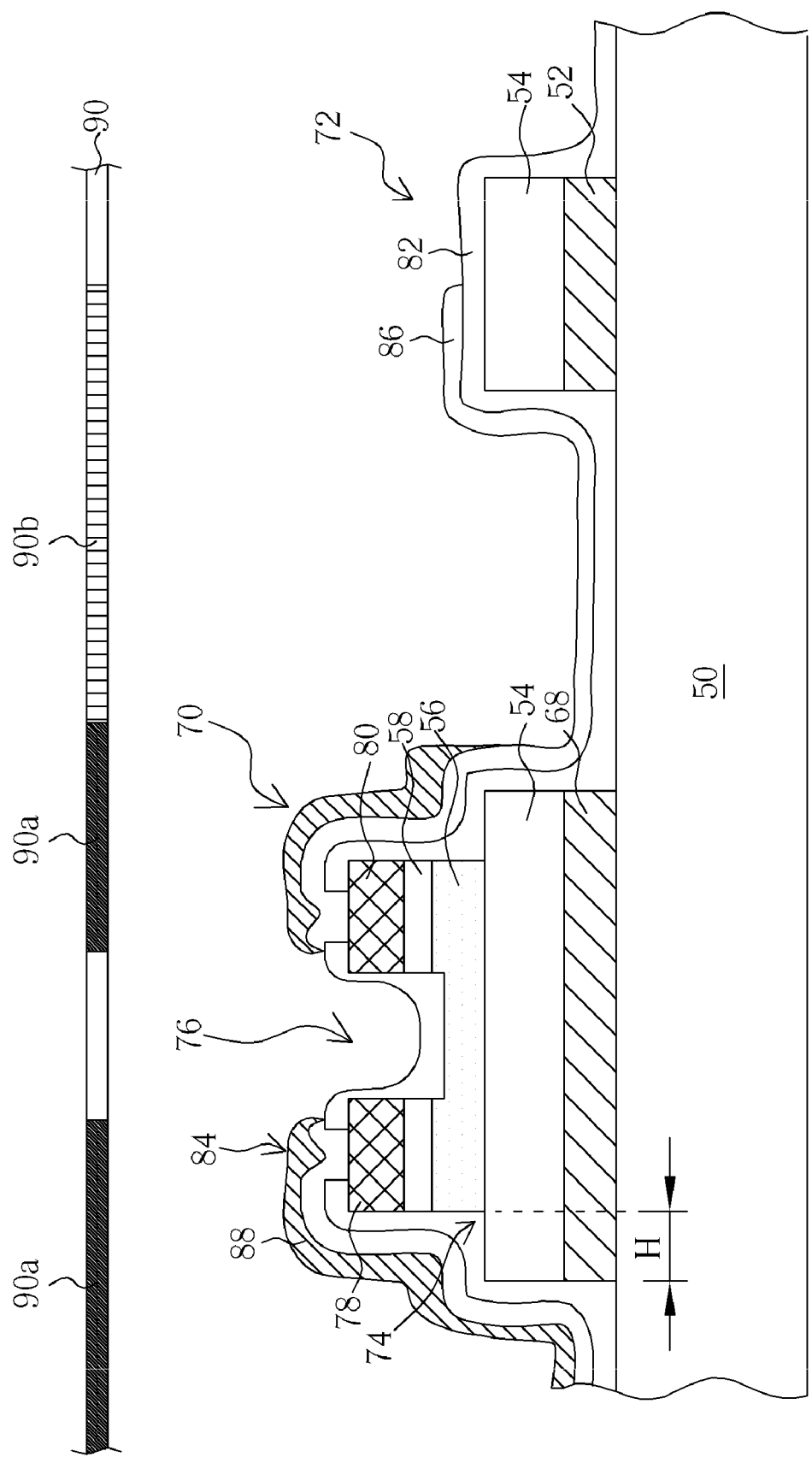

Referring to FIG. 11, a third conductive layer and a fourth conductive layer are successively formed on the substrate 50, and a third PEP is performed to form a pixel electrode 86 with the third conductive layer covering a portion of the passivation layer 82 and the source electrode 80 and to form a wire structure 88 (such as a signal line or a signal electrode) with the fourth conductive layer electrically connected to the drain electrode 78. During the third PEP, a half-tone mask 90 may be used to perform the photolithography process after forming a photoresist layer (not shown) on the fourth conductive layer, wherein the opaque region 90a and the half-tone region 90b of the half-tone mask 90 correspond the predetermined wire structure 88 and the pixel electrode 86 respectively.

However, in other embodiments, the pixel electrode 86 and the wire structure 88 may be formed through different PEPs.

Figure 12:
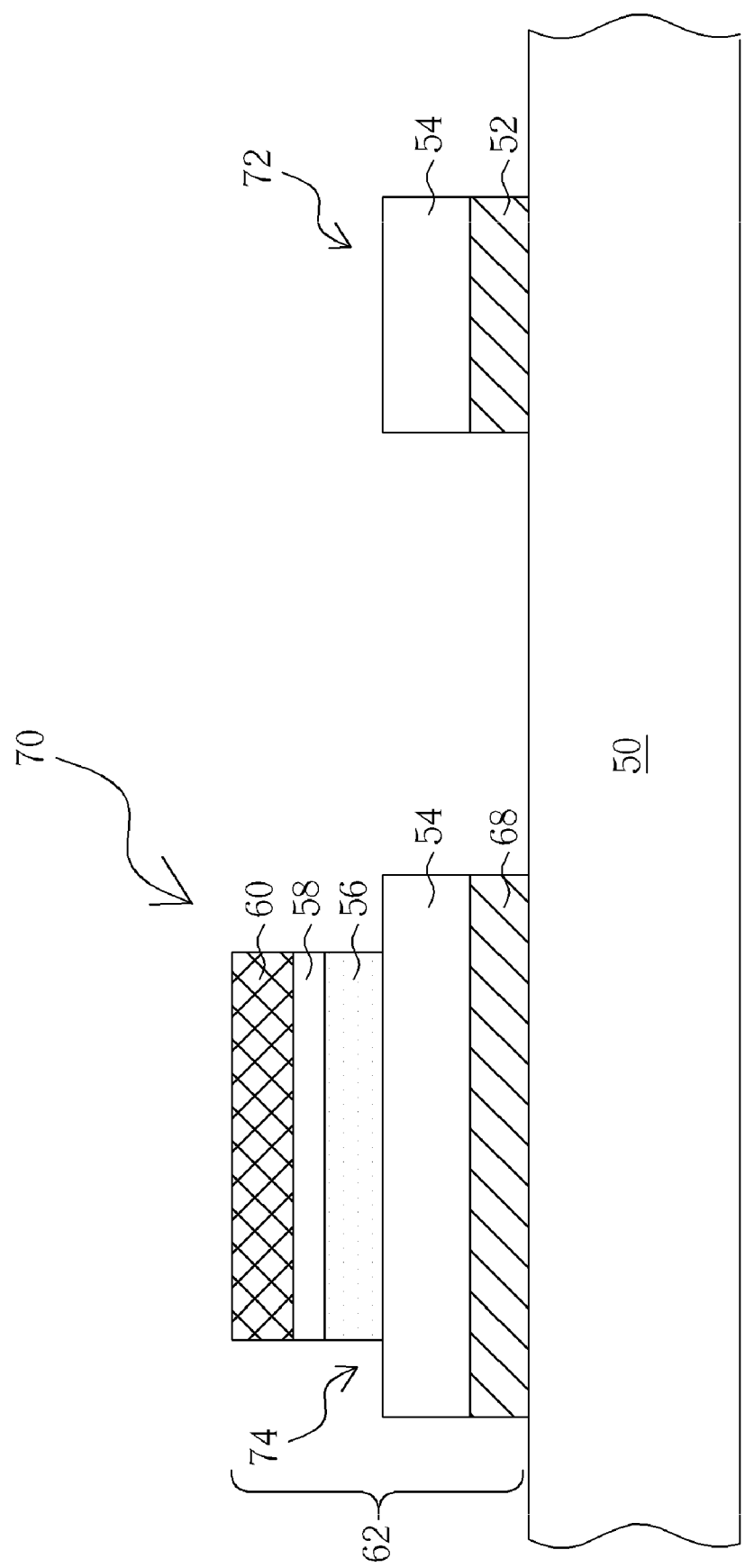
FIGS. 12-13 are schematic diagrams of the fabrication process of a thin-film transistor according to a second embodiment of the present invention.
Figure 13:
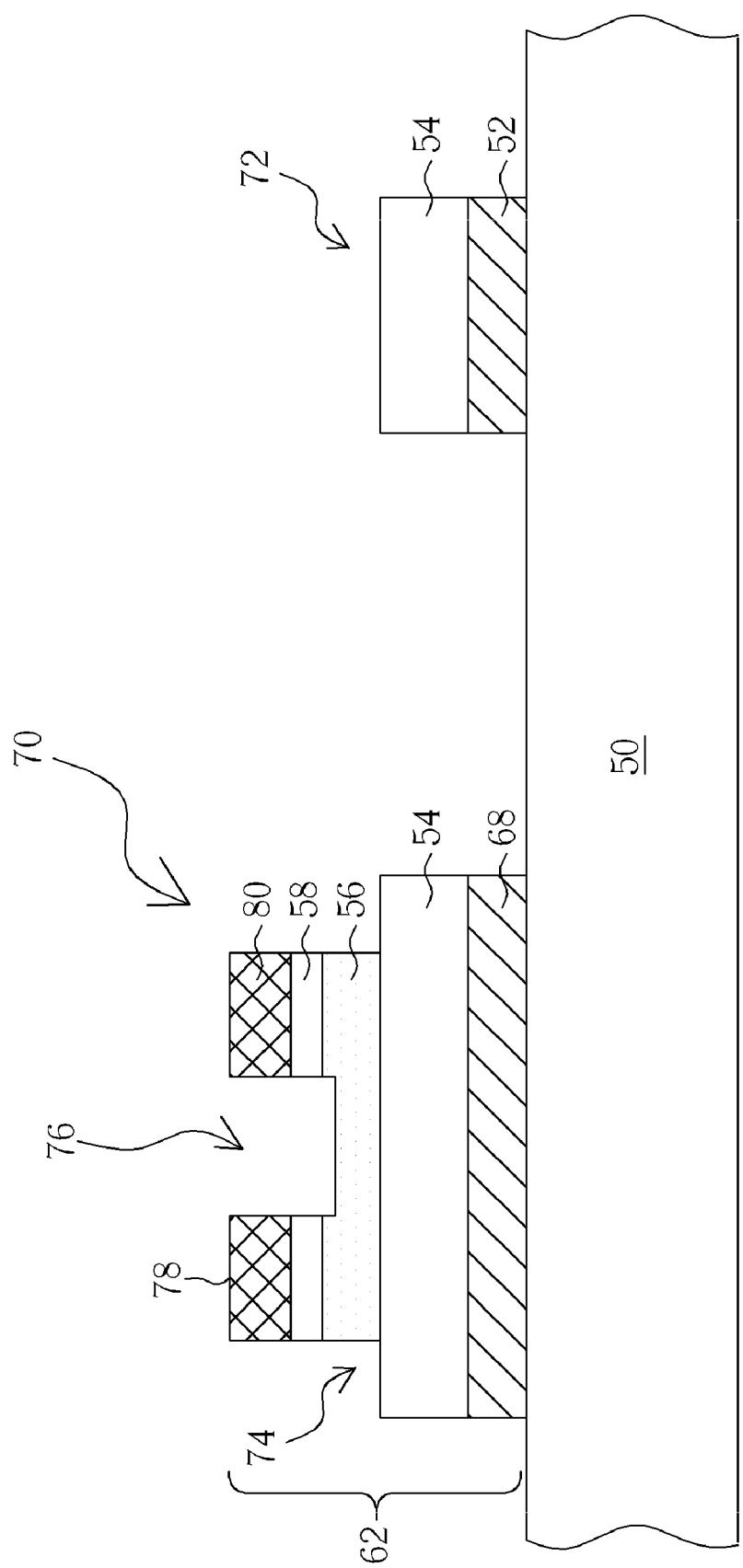

Referring to FIGS. 12-13, FIGS. 12-13 are schematic diagrams of the fabrication process of a thin-film transistor according to a second embodiment of the present invention. FIG. 12 is a continuation of the fabrication process of FIG. 6. After the first PEP, a semiconductor island 70, a gate electrode 68, and a wire structure 72 are formed on the surface of the substrate 50, wherein the areas of the gate electrode 68 and the insulating layer 54 are both larger than the area of the semiconductor island 70 so that stair structures 74 are formed at two sides of the four thin films 62 to contribute to form the passivation layer on the semiconductor island 70, which may uniformly step cover the surfaces of the whole semiconductor island 70 and the gate electrode 68. The photoresist layer 64 is removed after the first PEP.

Thereafter, as shown in FIG. 13, a laser ablation process is carried out to the semiconductor island 70 to directly remove a portion of the second conductive layer 60 so as to define the channel pattern 76 of the thin-film transistor. Then, the second conductive layer 60 is taken as an etching mask to perform an etching process to the ohmic contact layer 58 for removing a portion of the ohmic contact layer 58 and selectively removing the surface of a portion of the semiconductor layer 56. Sequentially, a source electrode 80 and a drain electrode 78 not connect with each other are formed at the semiconductor layer 56. The following processes may be performed as mentioned above in the first embodiment, shown in FIGS. 10-11 to perform a second, a third PEP, or another laser ablation process to sequentially form the passivation layer 82, pixel electrode 86, and the wire structure 88 serving as the signal line to complete the fabrication of the thin-film transistor.

The laser ablation process can be applied to stocked materials having obvious difference between the upper layer material and the lower layer material, and may directly define accurate patterns on the upper layer material with a simple process. Therefore, the present invention method for forming a thin-film transistor is able to directly define the semiconductor channel pattern through the laser ablation process. As a result, at least a PEP may be omitted. In addition, after forming the passivation layer, a laser ablation process may be further carried out to form contact holes on the source electrode and drain electrode according to the present invention method to omit another PEP. Accordingly, in contrast to the prior art, the present invention method for fabricating a thin-film transistor only includes two or three PEPs so that the number of utilized photomask is lowered for effectively reducing fabrication cost. Furthermore, the present invention method provides a thin-film transistor structure that no semiconductor layer is positioned right below most portions of the data line so that photo current problems can be effectively avoided, resulted in a more stable quality of the thin-film transistors. In addition, the half-tone region of a half-tone mask utilized in the present invention method is used to define the wire pattern and the protrudent portions from the semiconductor island at two sides of the gate electrode, not the channel pattern, and therefore it is not necessary to use a half-tone mask as precision as the prior-art half-tone mask for defining the channel pattern through its half-tone region. Moreover, even though a defect of pattern transference of the wire pattern from the half-tone region occurs, its influence to the performance of the whole display panel is negligible. Accordingly, the present invention method effectively decreases the photomask cost and improves the quality of the thin-film transistor, and furthermore provides a liquid crystal display panel with preferable quality.

Since the present invention method can fabricate thin-film transistors with less photolithography processes, the utilization of the present invention method and thin-film transistor structure is not only limited to the liquid crystal display panels but may be applied to any display panels or devices having thin-film transistors, such as organic light emitting displays, with the sprit of the present invention to fabricate a thin-film transistor array with good quality and low costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thin-film transistor, comprising:
   a gate electrode positioned on a substrate;
   a gate insulating layer covering the gate electrode;
   a semiconductor island positioned on the gate insulating layer;
   a source electrode and a drain electrode positioned on two sides of the semiconductor island, the source electrode and the drain electrode being not connected to each other;
   a passivation layer covering the gate electrode, the gate insulating layer, the semiconductor island, the source electrode, the drain electrode, and the substrate; and
   a pixel electrode covering a portion of the passivation layer and the source electrode, electrically connecting the source electrode;
   wherein the sizes of the gate insulating layer and the gate electrode are approximately the same and are larger than the size of the semiconductor island so that the gate insulating layer and the gate electrode protrude from the two sides of the semiconductor island to form a stair structure respectively, and the passivation layer step covers the surfaces of the stair structures, wherein the passivation layer directly contacts portions of the gate electrode.

2. The thin-film transistor of claim 1, wherein the gate electrode and the gate insulating layer of each of the stair structures protrude more than about 2 micrometers from the surface of the semiconductor island.

3. The thin-film transistor of claim 1, wherein the semiconductor island comprises an amorphous silicon layer.

4. The thin-film transistor of claim 3, wherein the semiconductor island further comprises a doped amorphous silicon layer positioned above the amorphous silicon layer.

5. The thin-film transistor of claim 1, wherein the thin-film transistor further comprises a signal electrode positioned above a portion of the passivation layer on the drain electrode and electrically connected to the drain electrode and a wire structure.

6. The thin-film transistor of claim 1, wherein the gate insulating layer exposes a sidewall of the gate electrode.

* * * * *